(12) United States Patent
Jyumonji et al.

(10) Patent No.: US 7,550,694 B2
(45) Date of Patent: Jun. 23, 2009

(54) LASER ANNEAL APPARATUS

(75) Inventors: Masayuki Jyumonji, Yokohama (JP);
Yukio Taniguchi, Yokohama (JP);
Masakiyo Matsumura, Kamakura (JP);
Masato Hiramatsu, Tokyo (JP); Yoshio Takami, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 603 days.

(21) Appl. No.: 11/299,789

(22) Filed: Dec. 13, 2005

(65) Prior Publication Data
US 2006/0138351 A1 Jun. 29, 2006

(30) Foreign Application Priority Data
Dec. 24, 2004 (JP) .............................. 2004-374474

(51) Int. Cl.
*B23K 26/02* (2006.01)
*H01L 21/268* (2006.01)
(52) U.S. Cl. ........................... 219/121.65; 219/121.61; 219/121.62
(58) Field of Classification Search ............ 219/121.61, 219/121.62, 121.65, 121.66, 121.83; 438/487, 438/795; 250/492.2; 359/558; 356/399, 356/400
See application file for complete search history.

(56) References Cited

U.S. PATENT DOCUMENTS

| | | | | |
|---|---|---|---|---|
| 3,980,397 A * | 9/1976 | Judd et al. | ................. | 359/558 |
| 4,059,359 A * | 11/1977 | Foster et al. | ................. | 374/32 |
| 4,631,416 A * | 12/1986 | Trutna, Jr. | ................. | 356/400 |
| 4,692,623 A * | 9/1987 | Roberts et al. | ................. | 374/32 |
| 4,804,270 A * | 2/1989 | Miller et al. | ................. | 356/508 |
| 5,991,015 A * | 11/1999 | Zamel et al. | ............ | 219/121.61 |
| 6,323,457 B1 * | 11/2001 | Jung | ..................... | 219/121.62 |
| 6,341,042 B1 * | 1/2002 | Matsunaka et al. | .......... | 359/618 |
| 6,816,233 B2 * | 11/2004 | Sugita | ..................... | 250/492.2 |
| 2003/0096176 A1 * | 5/2003 | Miyamae et al. | ............ | 356/399 |
| 2004/0061149 A1 * | 4/2004 | Jyumonji et al. | ............ | 257/268 |

(Continued)

FOREIGN PATENT DOCUMENTS

JP 63-173930 A * 7/1988

(Continued)

OTHER PUBLICATIONS

"Flat Panel Display 1999", Nikkei Micro Device Separate Volume, Nikkei BP Inc., 1998, pp. 132-139.

*Primary Examiner*—Geoffrey S Evans
(74) *Attorney, Agent, or Firm*—Oblon, Spivak, McClelland, Maier & Neustadt, P.C.

(57) ABSTRACT

A laser anneal apparatus is provided with a laser source; a homogenizing optical system disposed in an optical path of laser light emitted from the laser source to homogenize an intensity distribution of the laser light in a section which is perpendicular to the optical path; a phase shifter disposed in the optical path of the laser light passed through the homogenizing optical system to produce an intensity distribution pattern of the laser light in the section which is perpendicular to the optical path; a photoreceptor device disposed in the optical path of the laser light passed through the phase shifter to intercept a part of the laser light and to measure a quantity of the intercepted laser light; and an image-forming optical system disposed in the optical path of the laser light passed through the photoreceptor device to focus the laser light on a substrate to be treated.

7 Claims, 4 Drawing Sheets

U.S. PATENT DOCUMENTS

2004/0099645 A1 * 5/2004 Kawamoto et al. ..... 219/121.65

FOREIGN PATENT DOCUMENTS

| | | | |
|---|---|---|---|
| JP | 10-144987 A * | 5/1998 | |
| JP | 2004-193229 | 7/2004 | |
| JP | 2005-55583 A * | 3/2005 | |
| SU | 1465718 A1 * | 3/1989 | |

* cited by examiner

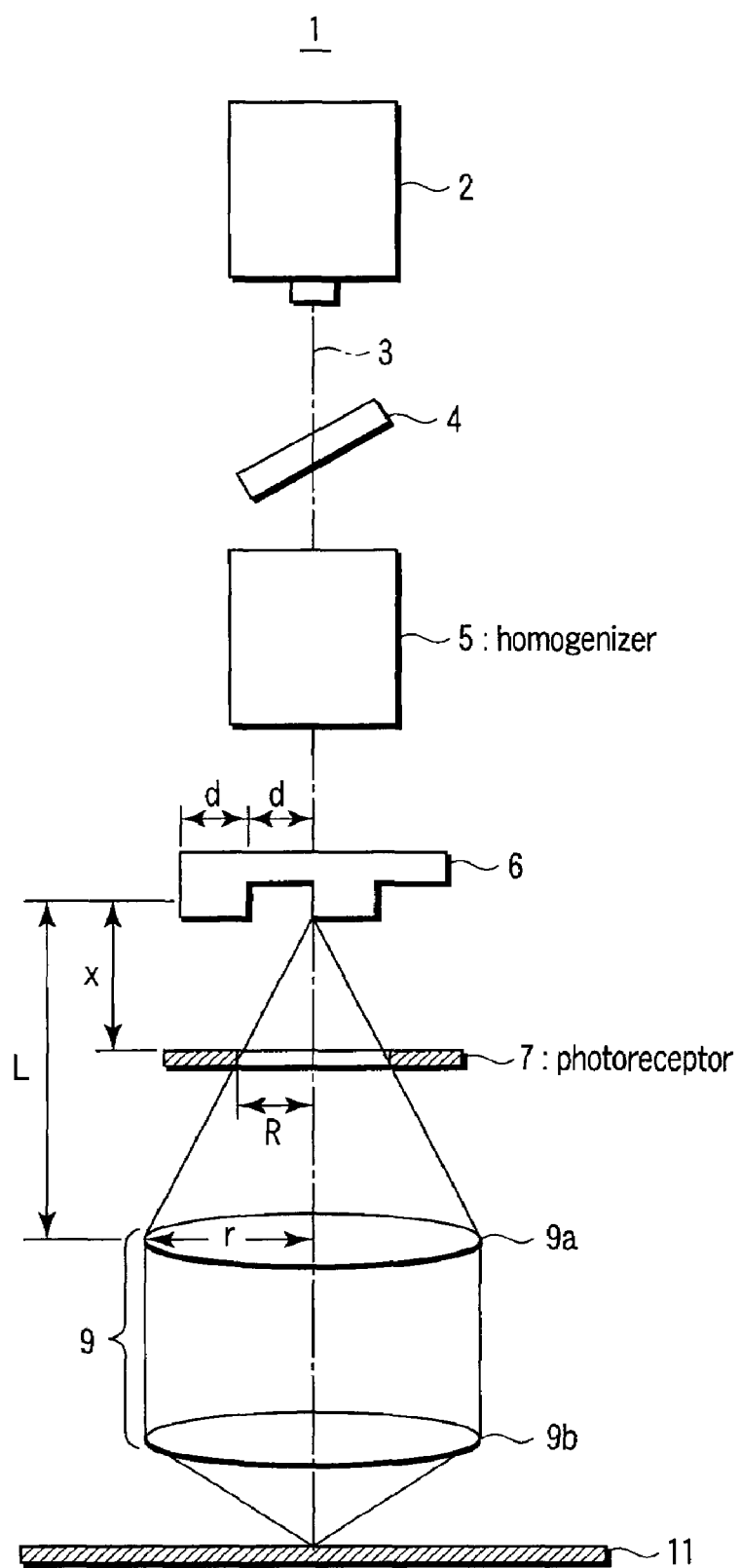
F I G. 1

LASER ANNEAL APPARATUS

CROSS-REFERENCE TO RELATED APPLICATIONS

This application is based upon and claims the benefit of priority from prior Japanese Patent Application No. 2004-374474, filed Dec. 24, 2004, the entire contents of which are incorporated herein by reference.

BACKGROUND OF THE INVENTION

1. Field of the Invention

The present invention relates generally to a laser anneal apparatus for use in a process of manufacturing a semiconductor integrated circuit, more particularly to a laser anneal apparatus suitable for a process of manufacturing a thin film transistor for use in a flat panel type display device.

2. Description of the Related Art

In a flat panel type display device such as an active matrix type liquid crystal display device or an organic EL display device, a large number of thin film transistors (hereinafter abbreviated as TFT) are formed on an insulating substrate made of glass or plastic in order to individually drive pixels. Since an amorphous silicon (a-Si) film can be relatively easily formed at a low forming temperature by a gas phase process, and has a superior productivity, the film is broadly used as a semiconductor thin film for forming source, drain, and channel areas of the TFT.

However, the amorphous silicon thin film has a drawback that the film is inferior to a polycrystal silicon (poly-Si) film in physical properties such as conductivity (mobility of a-Si is lower than that of poly-Si by a factor of two digits or more). Therefore, it has been requested that the method of forming the source, drain, and channel areas of the TFT in the polycrystal silicon thin film be established in order to increase an operation speed of the TFT.

In the present situation, for example, an excimer laser annealing process (hereinafter referred to as the ELA process) using excimer laser is adopted as a method of forming the polycrystal silicon thin film (Flat Panel Display 1999/Nikkei Micro Device Separate Volume, pp. 132 to 139 (Nikkei BP Inc., 1998)). This annealing process can be performed in a temperature range (e.g., from room temperature to about 500° C.) in which a versatile glass substrate is usable. In the ELA process, for example, after depositing the amorphous silicon thin film into a predetermined thickness (e.g., 50 nm) on the substrate, this amorphous silicon thin film is irradiated with krypton fluoride (KrF) excimer laser light (wavelength of 248 nm), xenon chloride (XeCl) excimer laser light (wavelength of 308 nm) or the like to locally melt and recrystallize the amorphous silicon thin film, and the film is changed into the polycrystal silicon thin film.

When an average intensity (fluence) of the laser light is changed, the excimer laser annealing is applicable to various processes including the crystallization of the amorphous silicon thin film. For example, when the intensity of the laser light is set to a region only having a heating function, the annealing can be used in an impurity activation step which is required for manufacturing the TFT. When the intensity of the laser light is excessively raised, a rapid temperature rise is caused. Therefore, the annealing can be utilized in removing films during the manufacturing of the TFT. It is to be noted that utilization of these phenomena is applicable to not only the TFT but also a general semiconductor manufacturing process.

However, in a case where the TFT is constituted of the polycrystal silicon thin film in order to increase the operation speed in a flat panel type display device such as a liquid crystal display device or an organic EL display device, when there is a fluctuation in the number or distribution of crystal grain boundaries included in the channel area of each TFT, a large fluctuation is generated in a threshold voltage (Vth) between the TFTs. This becomes a factor to deteriorate operation characteristics of the whole display device and lower an image quality. Therefore, it has been demanded that the crystal grain boundary in each channel area be homogenized as much as possible or a crystal grain diameter be set to be larger than a size of the channel area and a position of the crystal grain be controlled to thereby remove the crystal grain boundary from each channel area.

The present inventors investigate a laser annealing process for forming a silicon thin film which has a large crystal grain diameter. According to the process, when an optical device called "phase shifter" is inserted into an optical path irradiated with the laser light to thereby adjust a secondary intensity distribution of the laser light on the amorphous silicon thin film, crystal grains are grown into large sizes. Here, the phase shifter is an optical device in which a fine planar pattern such as line and space is constituted of stepped portions including recessed and protruding portions in a transparent quartz substrate. In the phase shifter, a phase difference is made in a part of the laser light which passes through the shifter, and the secondary intensity distribution of the laser light is produced by diffraction of the laser light and interference between the laser light having different phases. Therefore, when the secondary intensity distribution of the laser light is adjusted, a temperature distribution is generated on a substrate to be treated. Accordingly, silicon single crystals having large grain diameters of about two to seven microns can be formed while positions of the crystals are controlled.

The following problems have been found in developing such laser annealing process.

A first problem accompanies generation of high-order diffracted light. To stably form a crystallized region having a required large grain diameter, an intensity distribution pattern in a micro region of a sub-micron level is very important as to the laser light with which the amorphous silicon thin film is irradiated. The phase shifter having fine recessed/protruding portions is used in order to form such intensity distribution pattern with a good efficiency. However, such phase shifter generates the high-order diffracted light in accordance with pitches of the lines and spaces or the recessed and protruding portions, and there is generated a large quantity of light that does not enter the substrate to be treated. For example, when the phase shifter having a pitch d [μm] of the line and space is perpendicularly irradiated with the laser light having a wavelength λ [μm], order-n diffracted light is generated in addition to rectilinearly traveling light (order-0 light). An angle θn formed by the order-n diffracted light and the order-0 light is given by the following equation:

$$\theta n = \sin^{-1}(n\lambda/d),$$

wherein $0 \leq \theta n \leq 90°$: n=0, ±1, ±2, . . .

That is, when the order (n) increases, the angle (θn) formed by the order-n diffracted light and the order-0 diffracted light increases. Therefore, the high-order diffracted light having the increased angle formed with the order-0 diffracted light enters an inner wall of the apparatus or another optical system (optics), and causes an unintended problem.

Even in the optical device other than the phase shifter, for example, a photo mask having a metal thin film provided with an opening which passes light, unintended high-order diffracted light is sometimes generated depending on a shape of the opening. In general, as a countermeasure against the light which does not enter the substrate to be treated, a method is adopted in which a path from the optical device to an image-forming optical system is disposed in a sealed box, and the high-order diffracted light is confined in the box. However, in this method, the high-order diffracted light is simply absorbed by the inside of the apparatus or a wall surface of the box. Such light is not utilized in the crystallization at all. Moreover, adverse effects are caused by the absorption of the light. For example, inner components are deteriorated (e.g., photo or thermal deterioration), and a gas or the like is generated owing to the temperature rise and tissue change caused by the absorption of the light.

It is to be noted that in an exposure device for use in photolithography, an aperture is disposed in an intermediate portion of the image-forming optical system in order to remove the high-order diffracted light. However, in an activation or crystallization process of the semiconductor thin film, since the laser light has high energy, and the high-order diffracted light has intense energy, such countermeasure has its limitation.

A second problem accompanies "non-emitted shot" in the laser anneal apparatus. It is to be noted that in the following description, the "non-emitted shot" includes both of a case where any laser pulse is not generated and a case where the laser intensity is low or an emission time is short.

In a case where the laser pulse is intermittently emitted, when there is temporarily a defect in laser oscillation for a certain cause, an annealing defect is generated unless information indicating the defect is fed back to the laser anneal apparatus. For example, when any laser pulse is not generated or the pulse intensity is lower than a target value, an insufficiently annealed area is generated, and yields of final products (e.g., display device) are deteriorated. Specifically, since a partial area is not crystallized at all, or the crystallization or the activation is insufficient in the crystallization process performed by the laser annealing, targeted transistor characteristics or characteristic uniformity cannot be obtained, and a pixel defect or color unevenness is generated.

Usually, excimer laser has a high annealing capability accompanying ultraviolet light, but an oscillation characteristic is unstable. Specifically, although a trigger signal is input from the outside, the laser sometimes fails to oscillate. Even if the laser oscillates, oscillation intensity is excessively weak (e.g., half or less of a target value). In the excimer laser, the pulse oscillation is caused by high-voltage discharge in a gas, and the above-described instability is attributable to characteristics of a current element called a thyratron for use in the high-voltage discharge. Therefore, it is difficult to eliminate the above-described instability at the present time. Since such problem appears as a fluctuation of the crystal grain diameter in the laser annealing process, the problem obstructs mass production.

It is to be noted that excimer laser which does not use any thyratron has been developed, but a burden on a power circuit is large, and there is a problem of reliability drop or cost rise.

In the above-described document, there is described a method of judging whether or not a laser light shot is the non-emitted shot. According to the method, an optical component which splits a part of a luminous flux is disposed between a laser source and the substrate to be treated, and the intensity of the split light is monitored. When it is judged that the intensity of the split light is not normal, the position is returned to a position corresponding to the shot, and the laser pulse is emitted again. However, such method has the following problem. Firstly, since the laser light is split, the intensity of the laser light with which the substrate to be treated is irradiated is lowered. Secondly, since many optical components such as the light-splitting optical component and a photo detector have to be installed in the apparatus, the apparatus is enlarged and complicated.

BRIEF SUMMARY OF THE INVENTION

The present invention has been developed in consideration of the above-described problems of the conventional laser anneal apparatus, and an object of the present invention is to provide a laser anneal apparatus capable of securely detecting an non-emitted shot, and at the same time effectively intercepting high-order diffracted light generated in an optical device.

According to the present invention, there is provided a laser anneal apparatus which irradiates a substrate to be treated with laser light to anneal the surface of the substrate, comprising:

a laser source;

a homogenizing optical system disposed in an optical path of the laser light emitted from the laser source to homogenize an intensity distribution of the laser light in a section which is perpendicular to the optical path;

an optical device disposed in the optical path of the laser light passed through the homogenizing optical system to produce an intensity distribution pattern of the laser light in the section which is perpendicular to the optical path;

a photoreceptor device disposed in the optical path of the laser light passed through the optical device to intercept a part of the laser light and to measure a quantity of the intercepted laser light; and an image-forming optical system disposed in the optical path of the laser light passed through the photoreceptor device to focus the laser light on the substrate to be treated.

For example, the optical device is a phase shifter which imparts a phase difference to the laser light passed through the optical device to produce the intensity distribution pattern of the laser light in the section by means of interference between the laser light having different phases.

For example, the optical device is a photo mask in which a mask pattern is formed of a metal thin film.

Preferably, the photoreceptor device is disposed in the section which is perpendicular to the optical path, and has:

an intercepting portion to intercept a part or all of the laser light which does not enter the image-forming optical system; and a passing portion to pass all of the laser light which enters the image-forming optical system.

In this case, the photoreceptor device preferably has an annular photoelectric device or thermoelectric device to measure the quantity of the intercepted laser light.

Preferably, the photoreceptor device has a circular opening which is concentric with respect to an optical axis of the image-forming optical system, and a radius R of the opening satisfies the following conditions:

$$rx/L \leq R,$$

wherein X denotes a distance between the photoreceptor device and the optical device, L denotes a distance between the photoreceptor device and the image-forming optical system, and r denotes a radius of the image-forming optical system.

Alternatively, in place of the opening, there may be disposed a light transmitting portion made of an optical material having a sufficient transmittance (e.g., a transmittance of 90% or more) respect to the laser light for use.

When the laser annealing is performed by use of the apparatus of the present invention, it can be monitored whether or not laser oscillation is normally performed based on a quantity of laser light measured by the photoreceptor device during an actual operation. When a shape of the photoreceptor device is appropriately designed, the high-order diffracted light generated in the optical device can be effectively intercepted.

Moreover, the quantity of the laser light measured by the photoreceptor device in this manner can be displayed in real time, recorded in a storage medium, or output to a printer.

Furthermore, power obtained by the photoreceptor device can be reused as the power of the laser source.

BRIEF DESCRIPTION OF THE SEVERAL VIEWS OF THE DRAWING

FIG. 1 is a diagram showing an outline of a laser anneal apparatus based on the present invention;

DETAILED DESCRIPTION OF THE INVENTION

Figure 2:
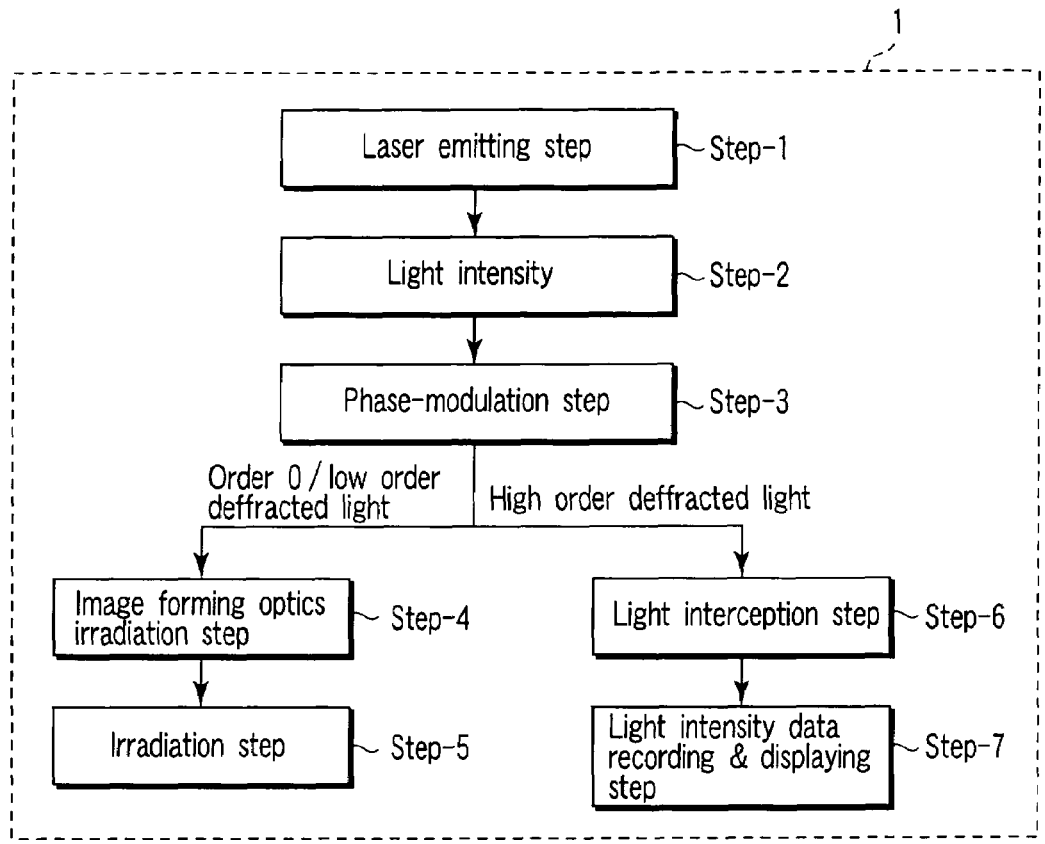
FIG. 2 is a flowchart showing a case where laser annealing is performed using the apparatus based on the present invention.

Next, one example of a laser anneal apparatus according to the present invention will be described with reference to the drawings. It is to be noted that in the drawings referred to hereinafter, shapes, dimensions, and arrangements of constituting elements are schematically shown to such an extent that description can be understood. In the respective drawings, the same or similar parts are denoted with the same reference numerals.

EMBODIMENT 1

FIG. 1 shows a schematic constitution of an optical system of a laser anneal apparatus according to the present invention. As shown in FIG. 1, the optical system of a laser anneal apparatus 1 is constituted of a laser source 2, an attenuator 4, a homogenizer 5, a phase shifter 6 (optical device), a photoreceptor device 7, and an image-forming optical system 9, and these components are arranged in this order.

As the laser source 2, for example, an excimer laser source (XeCl, KrF, ArF or the like) is used. Instead, as the laser source 2, another laser source may be used such as an order 3 or 4 higher harmonic wave of YAG laser of Q switch or solid laser.

The attenuator 4 is disposed in an optical path 3 of laser light emitted from the laser source 2. The attenuator 4 adjusts an energy amount of the laser light-into a predetermined energy amount depending on a purpose of laser irradiation by means of a computer (described later). The homogenizer 5 is disposed along the same axis as that of the optical path 3 in the optical path of the laser light emitted from the attenuator 4.

The homogenizer 5 homogenizes an intensity distribution (two-dimensional distribution) of the laser light in a section which is perpendicular to the optical path.

The phase shifter 6 is disposed in a focal position of the homogenizer 5. The phase shifter 6 imparts a phase difference to a part of the laser light which passes through the shifter, and produces the laser light intensity distribution in the section which is perpendicular to the optical path by means of diffraction of the laser light and interference between laser light having different phases. The phase shifter 6 imparts, to the laser light from the homogenizer 5, an intensity distribution pattern shaped depending on the purpose of the laser irradiation.

The photoreceptor device 7 is disposed along the same axis as that of the optical path 3 in the optical path of the laser light emitted from the phase shifter 6. The photoreceptor device 7 intercepts a part of the laser light from the phase shifter 6, and measures a quantity (energy) of the intercepted laser light. In the example mentioned herein, the photoreceptor device 7 is an annular photoelectric device. A diameter R of a central opening is designed in such a manner as to pass only low-order diffracted light which enters the image-forming optical system 9, and intercept high-order diffracted light which does not enter the image-forming optical system 9 among the diffracted light generated by the phase shifter 6.

The image-forming optical system 9 is disposed along the same axis as that of the optical path in the optical path of the laser light emitted from the photoreceptor device 7. The image-forming optical system 9 is provided with a first condenser lens 9a and a second condenser lens 9b. The image-forming optical system 9 reduces or enlarges, at a predetermined magnification, the laser light provided with the predetermined intensity distribution pattern by the phase shifter 6, and allows the light to enter the surface of a substrate 11 to be treated.

The apparatus 1 is a so-called projection type laser anneal apparatus, and the phase shifter 6 is disposed between the homogenizer 5 and the image-forming optical system 9. A characteristic of this apparatus 1 lies in that the photoreceptor device 7 is disposed between the phase shifter 6 and the first condenser lens 9a of the image-forming optical system 9. The photoreceptor device 7 intercepts the laser light which does not enter the image-forming optical system 9 and which is outwardly scattered among the diffracted light generated by the phase shifter 6, and measures a quantity of light.

Next, there will be described a laser annealing process performed using the apparatus of FIG. 1. FIG. 2 shows a flowchart of the laser annealing process. Steps are denoted with reference numerals 1 to 7, and the step numbers are indicated in corresponding portions of the following description.

As to laser light emitted from the laser source 2 (step 1), a two-dimensional intensity distribution is homogenized in a section by the phase shifter 6 (step 2). The homogenized laser light is phase-modulated by the phase shifter 6 (step 3). The phase-modulated laser light has, for example, an inversely peaked intensity distribution pattern.

The laser light emitted from the phase shifter 6 is divided into low-order diffracted light (including order-0 diffracted light) and high-order diffracted light diffracted at an angle larger than that of a pupil of the image-forming optical system 9. The low-order diffracted light passes through the opening of the photoreceptor device 7 and enters the first condenser lens 9a positioned in an incidence plane of the image-forming optical system 9 (step 4), and the high-order diffracted light enters an annular portion of the photoreceptor device 7 (step 6).

The incident laser light on the image-forming optical system 9 is reduced or enlarged at the predetermined magnification by the image-forming optical system 9. The condenser lens (first condenser lens 9a, second condenser lens 9b) of the image-forming optical system 9 has a function of reducing an image in a range of, for example, 1/1 to 1/20 time. The laser light emitted from the image-forming optical system 9 is focused on the surface of the substrate 11 to be treated. The substrate 11 to be treated is irradiated with the laser light and annealed (e.g., crystallized) (step 5).

On the other hand, the high-order diffracted light forms a large angle with an optical axis, and is diffracted outwardly from the pupil of the image-forming optical system 9. If the photoreceptor device 7 is not disposed, a wall surface of the apparatus or an outer periphery of the image-forming optical system 9 is irradiated with the high-order diffracted light, and the apparatus is damaged. To avoid the damage, the high-order diffracted light is intercepted by the photoreceptor device 7, and a quantity of the incident light on the photoreceptor device 7 is measured (step 6). Preferably, the quantity of the light measured by the photoreceptor device 7 is displayed in real time, recorded in a storage medium, or output to a printer (step 7).

The phase shifter 6 is an optical device in which a fine planar pattern such as a line and space is formed of stepped portions including recessed/protruding portions on, for example, a transparent quartz substrate. The phase shifter imparts a phase difference to a part of laser light which passes through the shifter, and produces an intensity distribution pattern of the laser light by means of the diffraction of the laser light and the interference between the laser light having different phases. In the laser annealing, there is used, for example, an inversely peaked pattern whose intensity is minimized in the center and continuously increases outwardly. The substrate 11 to be treated is irradiated with the laser light having the inversely peaked intensity distribution pattern (beam profile) to melt and subsequently solidify the semiconductor thin film on the surface of the substrate. Accordingly, a first solidifying area (i.e., a position where a crystal nucleus is generated) and a crystal growth process are controlled, and crystals can be grown from the crystal nucleus in parallel with the substrate surface (lateral growth; two-dimensional growth along a plane). In consequence, crystals having large grain diameters are formed while their positions are controlled. In this case, a desired light intensity distribution (beam profile) is formed depending on a shape of the phase shifter 6, a laser light angle distribution and the like.

Figure 3:
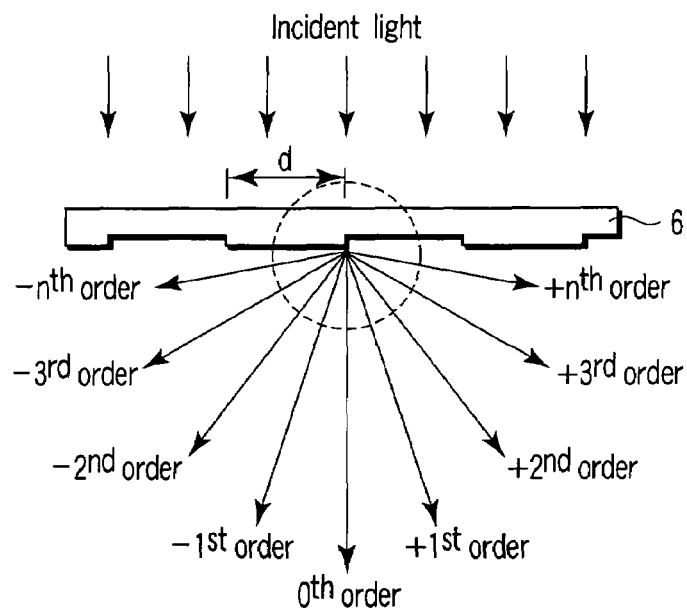
FIG. 3 is a schematic diagram showing a state of diffracted light generated by a phase shifter.

The phase shifter 6 is formed by, for example, working the stepped portions on a quartz plate as described above. When the laser light passes through the phase shifter 6, the laser light is diffracted. FIG. 3 schematically shows an outline. The laser light is diffracted on a number of stepped portions, but in FIG. 3, one stepped portion is noted, and diffraction angles from the portion are shown for the sake of simplicity.

Incident light parallel to the optical axis enters the phase shifter 6, and is diffracted by each stepped portion disposed on an emission surface of the phase shifter 6. In this case, assuming that a light center wavelength is $\lambda$, an interval between the adjacent stepped portions is d, and an angle formed by the optical axis and order-n diffracted light is $\theta_n$, the diffracted light is mutually strengthened on conditions that an optical path length difference between the light diffracted from the adjacent stepped portions is integer times the wavelength, that is, the conditions represented by the following:

$$n\lambda/d = \sin\theta_n.$$

Therefore, an angle of the order-n diffracted light is as follows:

$$\theta_n = \sin^{-1}(n\lambda/d),$$

wherein $0 \leq \theta_n \leq 90°$: n=0, ±1, ±2, ...

When the order (n) increases, the light travels in a direction deviating largely from the optical axis.

It is to be noted that the intensity of the order-n diffracted light changes with the stepped portion (phase difference) of the phase shifter 6, the shape of the phase shifter 6, the interval d between the adjacent stepped portions or the like. Therefore, as to the light emitted from the phase shifter 6, total energy of the high-order diffracted light is sometimes higher than that of the low-order diffracted light. Especially, in such case, the light emitted from the phase shifter 6 does not enter the image-forming optical system 9. That is, there increases the high-order diffracted light which has a large angle formed with the optical axis (n=0) and has a high intensity. Such high-order diffracted light does not enter the pupil of the image-forming optical system 9. The high-order diffracted light having high energy exists as stray light and scattered light in the optical system of the laser anneal apparatus 1. An unintended portion in the laser anneal apparatus 1, for example, a wall surface of the apparatus or an outer periphery of the image-forming optical system, is irradiated with the light, a temperature rise of the optical component is caused, and the apparatus is damaged.

Moreover, excimer laser light is ultraviolet light, and cannot be visually confirmed, and the intensity of the light is very large. Therefore, even when a laser light leak preventing measure is taken, it is difficult to secure sufficient security with respect to all of reflected light of the high-order diffracted light. If the light leaks from a gap or the like of the apparatus, a large security problem is generated. The unintended portion of the substrate 11 to be treated is irradiated with the reflected light. As a result, crystal growth is promoted or hindered in a position different from a target position.

Since the intensity of each-order diffracted light has a proportionality relation with that of the incident light, the intensity of the low-order diffracted light also has a proportionality relation with that of the high-order diffracted light. For example, when the intensity of a part of the high-order diffracted light is measured, the intensity of the low-order diffracted light for use in the laser annealing can be obtained.

It is to be noted that there has been described above the example of the laser anneal apparatus using the phase shifter 6 as the optical device for producing the intensity distribution pattern of the laser light. The optical device may be other than the phase shifter, and may be, for example, a photo mask provided with a mask pattern formed of a metal thin film. Even in such photo mask, the unintended high-order diffracted light is generated depending on the shape of the mask pattern. For example, in the photo mask having a latticed pattern constituted of fine wires, when the laser light passes through lattice openings, the laser light is diffracted, and the high-order diffracted light is generated. Even in such case, according to the laser anneal apparatus of the present invention, the high-order diffracted light which does not enter the image-forming optical system 9 is intercepted, and the intensity of the light is measured.

As described above, according to the laser anneal apparatus of the present invention, the high-order diffracted light, and the scattered light which is generated by scattering of the reflected high-order diffracted light and which does not enter the image-forming optical system 9 are effectively intercepted by disposing the photoreceptor device 7 between the phase shifter 6 and the incidence plane of the image-forming optical system 9, and the intensities of the light can be measured.

EMBODIMENT 2

Figure 4:
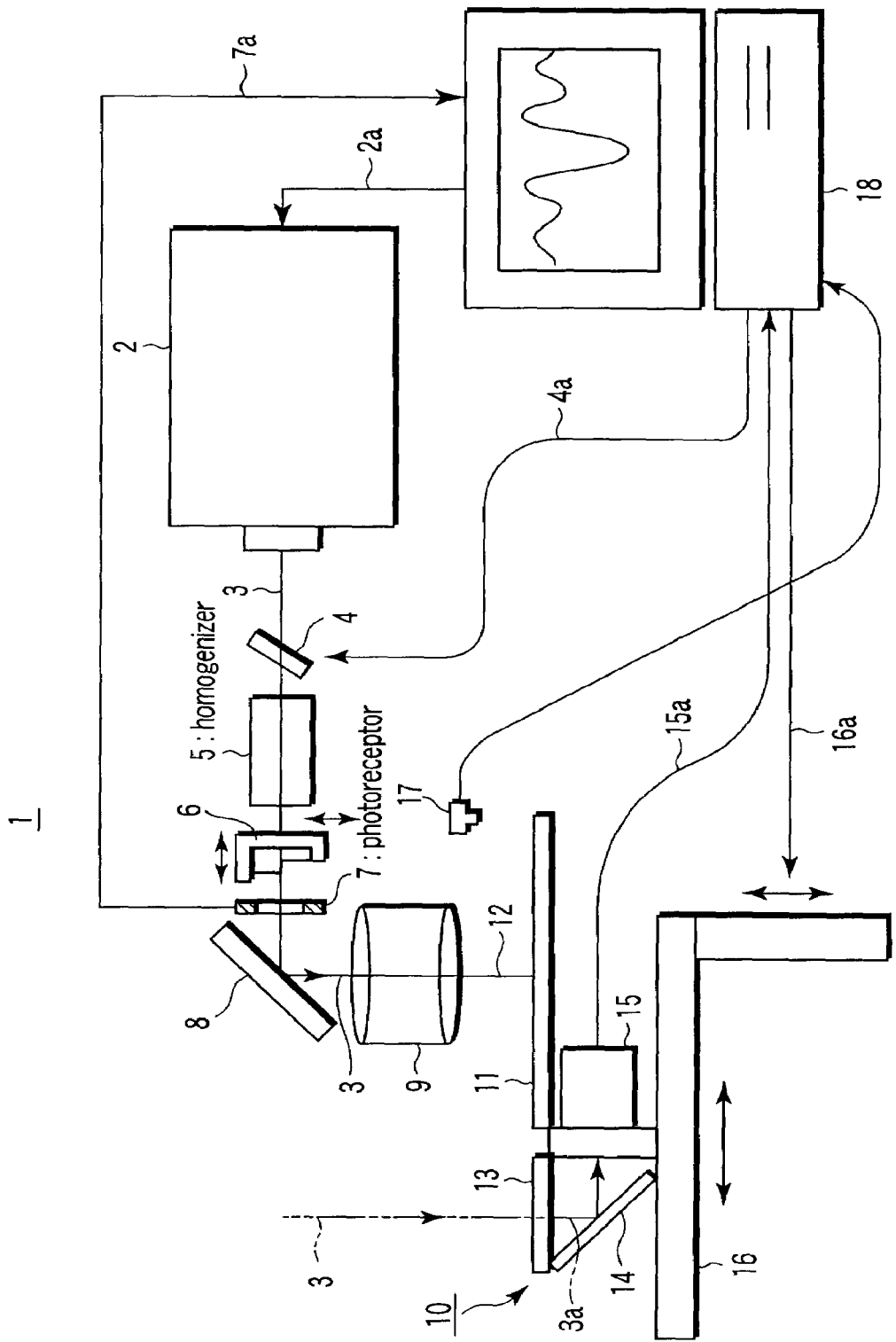
FIG. 4 is a diagram showing a schematic constitution of a projection type laser anneal apparatus based on the present invention.

FIG. 4 shows an example of a projection type laser anneal apparatus provided with a beam profiler based on the present invention. This apparatus includes an optical system shown in FIG. 1 as a main component. In FIG. 4, the same part as that of FIG. 1 is denoted with the same reference numerals.

The apparatus of FIG. 4 is provided with a laser source 2, an attenuator 4, a homogenizer 5, a phase shifter 6, a photoreceptor device 7, a mirror 8, and an image-forming optical system 9, and they are arranged in order along an optical path 3 from the side of the laser source 2. The laser source 2 emits laser light (excimer laser light in this embodiment). The homogenizer 5 homogenizes an intensity distribution of the incident laser light in a section. The homogenized laser light is phase-modulated by the phase shifter 6, and given an inversely peaked intensity distribution pattern. The laser light is reduced/enlarged at a predetermined magnification by the image-forming optical system 9, and selectively focused on the surface of a substrate 11 to be treated or a beam profiler 10 (light intensity distribution detecting device).

Here, the beam profiler 10 has a function of converting invisible light having an intensity distribution in a micro section into visible light and detecting the intensity distribution of the light. The beam profiler 10 includes a wavelength conversion material (e.g., fluorescent plate 13) for converting the invisible light into the visible light. The fluorescent plate 13 is a substrate constituted of a transparent material (e.g., transparent glass plate), and one surface (e.g., incidence side of invisible light 12) of the plate is coated with a fluorescent film. The fluorescent film includes a fluorescent substance for converting the incident invisible light 12 into the visible light.

The visible light having the intensity distribution in the micro section is reflected by a mirror 14 to enter a CCD camera 15. The fluorescent plate 13 is disposed on the same plane as that of the substrate 11 to be treated or a plane parallel to that of the substrate. In a case where the fluorescent plate 13 is disposed on the parallel plane, while a position of the surface of the fluorescent plate 13 is detected with a height sensor 17, a movable stage 16 is moved up and down, and the fluorescent plate 13 is positioned at a height equal to that of the substrate 11 to be treated.

Image data picked up by the CCD camera 15 is sent to a computer 18. This computer 18 slices the image data with arbitrary scanning lines, and calculates and outputs intensity and intensity distribution (beam profile) of laser light from the intensity distribution of an image signal. The computer 18 further compares the calculated intensity with a preset target intensity to calculate an operation amount, and sends an operation signal to the attenuator 4. An angle of the attenuator 4 is adjusted by performing feedback control so that the intensity of the laser light is adjusted into a target intensity.

As described above, an operation is performed to keep the intensity of the laser light to be constant. However, in the above-described method of measuring the intensity of the laser light, a state during an actual annealing treatment is not grasped in real time. For example, even in a case where there is a defect (i.e., "non-emitted shot") in laser oscillation for a certain cause during one-shot laser irradiation as described above, a problem of an annealing defect occurs. To solve the problem, in the present embodiment, in addition to a function of intercepting high-order diffracted light, the photoreceptor device 7 is provided with a function of measuring light intensity. A measured value of the light intensity measured by the photoreceptor device 7 is used in judging the above-described "non-emitted shot".

A photoelectric device or a thermoelectric device (e.g., pyrometer or calorie meter) is incorporated as a photo detector in the photoreceptor device 7 of FIG. 4. It is to be noted that the whole photoreceptor surface of the photoreceptor device 7 may be constituted of the photoelectric device or the thermoelectric device. The photoreceptor device 7 converts a quantity of incident laser light into a light intensity detecting signal, and sends the signal to the computer 18 via a signal line 7a. The computer 18 analyzes the light intensity detecting signal, and monitors the state of a laser annealing treatment. Moreover, the computer controls a crystallization device to execute a crystallization process. The computer 18 can display the laser light intensity distribution detected by the photoreceptor device 7, record the distribution in a storage medium, and/or output the distribution to a printer during an annealing treatment.

The computer 18 compares the light intensity detecting signal with a pre-input defined value of the light intensity to judge whether or not there is abnormality. Based on this judgment result, the computer 18 sends a movement signal to a driving mechanism for controlling movement of the stage 16 via a signal line 16a, or sends an oscillation control signal to the laser source 2 via a signal line 2a. That is, as a result of the judgment, when it is judged that the light intensity is not less than the defined value and is normal, the computer 18 relatively moves the substrate 11 to be treated with respect to the optical path 3 to adjust the optical path 3 into the next irradiation position. After setting the irradiation position of the laser light to the next annealing position, the computer 18 oscillates the laser source 2. On the other hand, as a result of the judgment, when it is judged that the light intensity is insufficient, the computer 18 does not relatively move the substrate 11 to be treated with respect to the optical path 3, but oscillates the laser source 2 again in the same position, or records the position to perform the irradiation later again.

Figure 5:
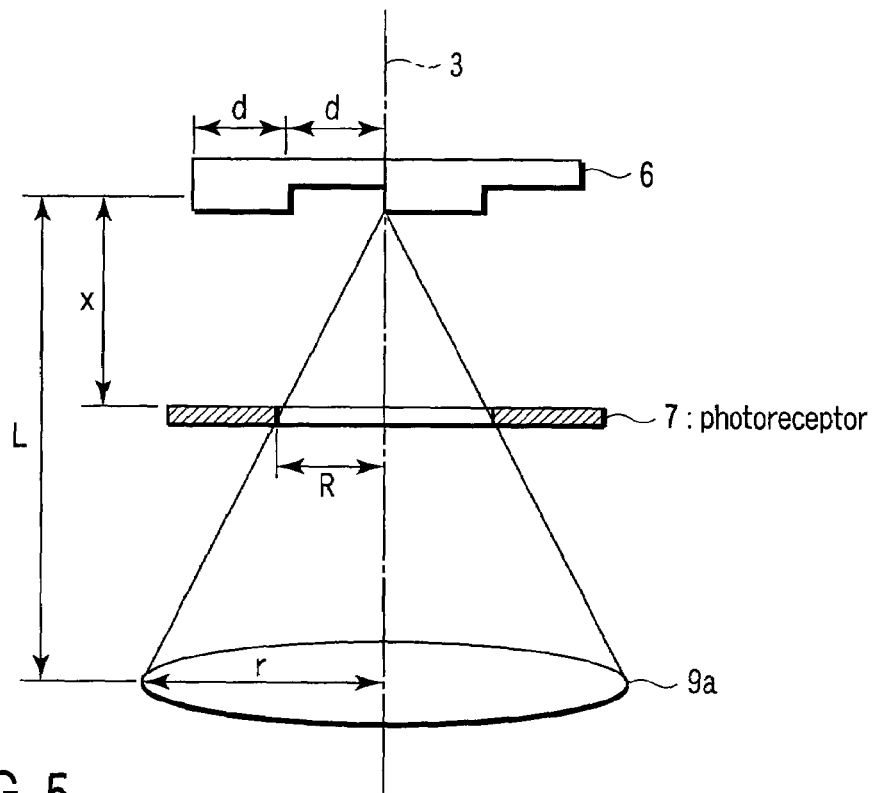
FIG. 5 is a diagram showing an arrangement of a photoreceptor device in the laser anneal apparatus based on the present invention.

FIG. 5 shows a typical example of a shape and an arrangement of the phase shifter 6. FIG. 5 shows in detail a mutual positional relation among the phase shifter 6, the photoreceptor device 7, and the first condenser lens 9a of an image-forming optical system in FIG. 1. In this example, the photoreceptor device 7 has an annular shape, and has an opening in the center. A radius R of this opening is given by the following equation:

$$R = rX/L,$$

wherein X denotes a distance between the photoreceptor device 7 and the phase shifter 6, L denotes a distance between the photoreceptor device 7 and the first condenser lens 9a, and r denotes a radius of the first condenser lens 9a.

When the radius R of the opening is set in this manner, all of the high-order diffracted light that does not enter the image-forming optical system 9 can be intercepted without decreasing a quantity of the laser light for use in the annealing, that is, a quantity of the incident laser light on the image-forming optical system 9.

It is to be noted that since the quantity of the laser light intercepted by the photoreceptor surface of the photoreceptor device 7 has a proportionality relation with that of the laser light passed through the opening for use in an annealing process, the light quantity can be measured during the annealing process.

The shape of the photoreceptor device 7 is not limited to an annular shape, and any shape may be used as long as the high-order diffracted light can be efficiently intercepted. FIGS. 6A to 6D show several examples of the shape of the photoreceptor device 7 for use in the laser anneal apparatus of the present invention.

Figure 6A:
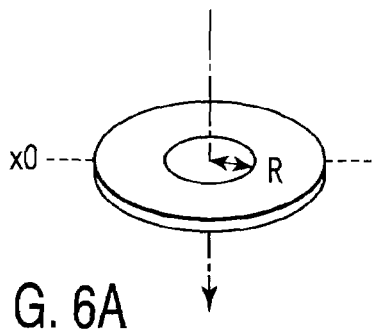
FIGS. 6A to 6D are diagrams showing various configuration examples of the photoreceptor device.
Figure 6B:
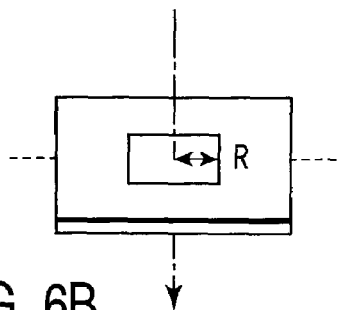

The photoreceptor device 7 of FIG. 6A is provided with an annular shape in the same manner as in FIG. 1 or 5. The photoreceptor device 7 of FIG. 6B has a rectangular flat-plate shape, and a rectangular opening is disposed in the center of the device. In this case, when a distance from the center to one side of the rectangular opening has the above-described length R, the laser light entering the image-forming optical system 9 is not intercepted by the photoreceptor device 7. When the photoreceptor device 7 is formed into the rectangular shape in this manner, it is easy to work the device, and enhancement of working precision is accordingly expected. It is to be noted that the central opening may have a circular shape having the radius R or a polygonal shape.

Figure 6C:
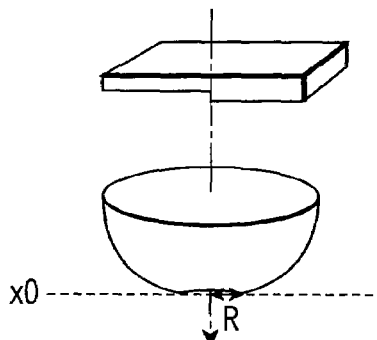
Figure 6D:
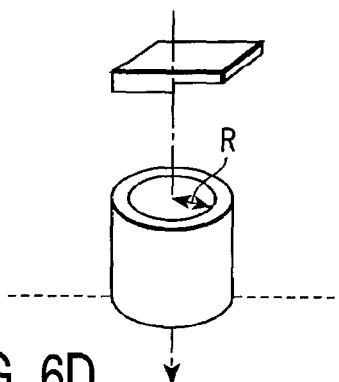

The photoreceptor device 7 of FIG. 6C has a cup shape, and an opening is disposed in a bottom portion of the shape. The photoreceptor device 7 of FIG. 6D has a cylindrical shape, and a section of a central through hole on a bottom-surface side corresponds to the opening shown in FIG. 6A. When a three-dimensional shape is formed in this manner, a radiation component of the high-order diffracted light in a lateral direction is intercepted with satisfactory efficiency, and the photoreceptor device 7 can be miniaturized. When the shape of the photoreceptor device 7 is three-dimensional in this manner, the device is preferably formed into such a shape as to cover the phase shifter 6.

It is to be noted that instead of disposing the opening in the center of the photoreceptor device 7 as described above, the center may be formed of a material which effectively passes the laser light for use in the annealing process.

An energy converting device is attached to the annular photoreceptor surface (intercepting surface) of the photoreceptor device 7. For example, a power meter of model number: PE50BB manufactured by OPHIR Co. can be disposed on the upper surface of the photoreceptor device 7 to measure the quantity of the laser light. Additionally, as the energy converting device, there is usable a semiconductor device having a sufficient photosensitivity and dynamic range with respect to the laser light for use, for example, the photoelectric device or the thermoelectric device (e.g., pyrometer or calorie meter). Furthermore, when the excimer laser light is converted into the visible light, a photo detector having a detecting sensitivity in a usual visible light region may be used. In this case, a front surface of the photo detector is provided with a filter which converts ultraviolet light into visible light, or a wavelength converting plate coated with a fluorescent substance emitting fluorescence of a visible light region on a wavelength side longer than an excimer laser wavelength by means of ultraviolet irradiation.

Moreover, the whole photoreceptor surface of the photoreceptor device 7 may be constituted of the photoelectric device or the thermoelectric device. In this case, since the laser light is received by use of the whole surface of the photoreceptor device 7, the quantity of the laser light increases, and measurement with a satisfactory precision is possible.

It is to be noted that when the photoreceptor device 7 is used, in addition to the measuring of the laser light quantity, the energy of the incident laser light on the photoreceptor surface can be recovered, and reused in the apparatus. Specifically, the photoelectric device (e.g., a device such as a solar battery) is attached to the photoreceptor surface, and the energy of the incident laser light is converted into power, and used in the apparatus.

There has been described above the example in which one photoreceptor device 7 is disposed between the phase shifter 6 and the image-forming optical system 9, but in a case where the high-order diffracted light is generated in an end portion of the opening of the photoreceptor device 7, a second photoreceptor device 7 having a large opening diameter may be disposed on an outlet side of the first photoreceptor device 7.

When the above-described photoreceptor device is incorporated in the laser anneal apparatus, it is possible to reduce damages of constituting components attributable to the high-order diffracted light. When the non-emitted shot is detected using this photoreceptor device, it is possible to improve yields of the laser annealing process.

What is claimed is:

1. A laser anneal apparatus which irradiates a substrate to be treated with laser light to anneal the surface of the substrate, comprising:
   a laser source;
   a homogenizing optical system disposed in an optical path of the laser light emitted from the laser source to homogenize an intensity distribution of the laser light in a section which is perpendicular to the optical path;
   an optical device disposed in the optical path of the laser light passed through the homogenizing optical system, the optical device being configured to diffract the laser light to generate low-order diffracted light and high-order diffracted light, thus producing an intensity distribution pattern of the laser light in the section which is perpendicular to the optical path;
   a photoreceptor device disposed in the optical path of the laser light passed through the optical device, the photoreceptor device having a portion where the low-order diffracted light passes and another portion where the high-order diffracted light is absorbed, and being configured to measure the intensity of the absorbed high-order diffracted light; and
   an image-forming optical system disposed in the optical path of the laser light passed through the photoreceptor device to focus the laser light on the substrate to be treated,
   wherein the intensity of the low-order diffracted light passed through the photoreceptor device is derived based on the intensity of the absorbed high-order diffracted light.

2. The laser anneal apparatus according to claim 1, wherein the optical device is a phase shifter which imparts a phase difference to the laser light passed through the optical device to produce the intensity distribution pattern of the laser light in the section by means of interference between the laser light having different phases.

3. The laser anneal apparatus according to claim 1, wherein the optical device is a photo mask in which a mask pattern is formed of a metal thin film.

4. The laser anneal apparatus according to claim 1, wherein the photoreceptor device is disposed in the section which is perpendicular to the optical path, and has:
   an intercepting portion to intercept a part or all of the laser light which does not enter the image-forming optical system; and
   a passing portion to pass all of the laser light which enters the image-forming optical system.

5. The laser anneal apparatus according to claim 4, wherein the photoreceptor device has an annular photoelectric device or thermoelectric device to measure the quantity of the intercepted laser light.

6. A laser anneal apparatus which irradiates a substrate to be treated with laser light to anneal the surface of the substrate, comprising:
  a laser source;
  a homogenizing optical system disposed in an optical path of the laser light emitted from the laser source to homogenize an intensity distribution of the laser light in a section which is perpendicular to the optical path;
  an optical device disposed in the optical path of the laser light passed through the homogenizing optical system to produce an intensity distribution pattern of the laser light in the section which is perpendicular to the optical path;
  a photoreceptor device disposed in the optical path of the laser light passed through the optical device to intercept a part of the laser light and to measure a quantity of the intercepted laser light; and
  an image-forming optical system disposed in the optical path of the laser light passed through the photoreceptor device to focus the laser light on the substrate to be treated,
  wherein the photoreceptor device is disposed in the section which is perpendicular to the optical path, and has:
    an annular photoelectric device or thermoelectric device to measure the intensity of the intercepted laser light; and
    a circular opening which is concentric with respect to an optical axis of the image-forming optical system, and a radius R of the opening satisfies the following conditions:

$rX/L \leq R,$ where X denotes a distance between the photoreceptor device and the optical device,
  L denotes a distance between the photoreceptor device and the image-forming optical system, and
  r denotes a radius of the image-forming optical system.

7. A laser anneal apparatus which irradiates a substrate to be treated with laser light to anneal the surface of the substrate, comprising:
  a laser source;
  a homogenizing optical system disposed in an optical path of the laser light emitted from the laser source to homogenize an intensity distribution of the laser light in a section which is perpendicular to the optical path;
  an optical device disposed in the optical path of the laser light passed through the homogenizing optical system to produce an intensity distribution pattern of the laser light in the section which is perpendicular to the optical path;
  a photoreceptor device disposed in the optical path of the laser light passed through the optical device to intercept a part of the laser light and to measure a quantity of the intercepted laser light; and
  an image-forming optical system disposed in the optical path of the laser light passed through the photoreceptor device to focus the laser light on the substrate to be treated,
  wherein the photoreceptor device is disposed in the section which is perpendicular to the optical path, and has:
    an annular photoelectric device or thermoelectric device to measure the intensity of the intercepted laser light; and
    a circular light transmitting portion which is concentric with respect to an optical axis of the image-forming optical system, the light transmitting portion being constituted of an optical material having a sufficient transmittance with respect to the laser light for use, and
    a radius R of the light transmitting portion satisfies the following conditions:

$rX/L \leq R,$ where X denotes a distance between the photoreceptor device and the optical device,
  L denotes a distance between the photoreceptor device and the image-forming optical system, and r denotes a radius of the image-forming optical system.

* * * * *